United States Patent
Shin et al.

(10) Patent No.: US 10,043,902 B2
(45) Date of Patent: Aug. 7, 2018

(54) SEMICONDUCTOR DEVICES WITH SHAPED PORTIONS OF ELEVATED SOURCE/DRAIN REGIONS

(71) Applicants: Chung-Hwan Shin, Seoul (KR); Sang-Bom Kang, Seoul (KR); Dae-Yong Kim, Yongin-si (KR); Jeong-Ik Kim, Seoul (KR); Chul-Sung Kim, Seongnam-si (KR); Je-Hyung Ryu, Suwon-si (KR); Sang-Woo Lee, Seoul (KR); Hyo-Seok Choi, Suwon-Si (KR)

(72) Inventors: Chung-Hwan Shin, Seoul (KR); Sang-Bom Kang, Seoul (KR); Dae-Yong Kim, Yongin-si (KR); Jeong-Ik Kim, Seoul (KR); Chul-Sung Kim, Seongnam-si (KR); Je-Hyung Ryu, Suwon-si (KR); Sang-Woo Lee, Seoul (KR); Hyo-Seok Choi, Suwon-Si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/963,731

(22) Filed: Dec. 9, 2015

(65) Prior Publication Data

US 2016/0233334 A1    Aug. 11, 2016

Related U.S. Application Data

(63) Continuation of application No. 13/788,599, filed on Mar. 7, 2013, now Pat. No. 9,240,323.

(30) Foreign Application Priority Data

May 24, 2012   (KR) .................. 10-2012-0055543

(51) Int. Cl.
*H01L 29/78*   (2006.01)
*H01L 21/28*   (2006.01)
(Continued)

(52) U.S. Cl.
CPC .... *H01L 29/7839* (2013.01); *H01L 21/26506* (2013.01); *H01L 21/28* (2013.01);
(Continued)

(58) Field of Classification Search
CPC .............. H01L 21/28; H01L 21/28518; H01L 21/76805; H01L 21/823425;
(Continued)

(56) References Cited

U.S. PATENT DOCUMENTS 6,159,856 A    12/2000   Nagano
8,541,820 B2    9/2013   Hayasaki et al.
(Continued)

FOREIGN PATENT DOCUMENTS

CN      101150070      6/2007
CN      102437088      5/2012
WO   WO 2012/041056 A1   4/2012

OTHER PUBLICATIONS

Office Action dated Dec. 22, 2016 for Taiwan Patent Application No. 102117973 (10 pages)—No English translation.

*Primary Examiner* — Brigitte Paterson
(74) *Attorney, Agent, or Firm* — Myers Bigel, P.A.

(57) ABSTRACT

A method of forming a semiconductor device can be provided by forming an opening that exposes a surface of an elevated source/drain region. The size of the opening can be reduced and a pre-amorphization implant (PAI) can be performed into the elevated source/drain region, through the opening, to form an amorphized portion of the elevated source/drain region. A metal-silicide can be formed from a metal and the amorphized portion.

9 Claims, 15 Drawing Sheets

(51) Int. Cl.
*H01L 29/66* (2006.01)
*H01L 29/40* (2006.01)
*H01L 21/285* (2006.01)
*H01L 21/265* (2006.01)
*H01L 29/165* (2006.01)
*H01L 23/485* (2006.01)
*H01L 21/768* (2006.01)
*H01L 27/092* (2006.01)
*H01L 29/08* (2006.01)
*H01L 29/16* (2006.01)
*H01L 29/161* (2006.01)

(52) U.S. Cl.
CPC .. *H01L 21/28518* (2013.01); *H01L 21/28537* (2013.01); *H01L 21/76814* (2013.01); *H01L 23/485* (2013.01); *H01L 27/092* (2013.01); *H01L 29/0847* (2013.01); *H01L 29/161* (2013.01); *H01L 29/165* (2013.01); *H01L 29/1608* (2013.01); *H01L 29/401* (2013.01); *H01L 29/665* (2013.01); *H01L 29/66636* (2013.01); *H01L 29/66643* (2013.01); *H01L 29/78* (2013.01); *H01L 29/7848* (2013.01); *H01L 2924/0002* (2013.01)

(58) Field of Classification Search
CPC ..... H01L 21/823807; H01L 21/823814; H01L 21/823871; H01L 23/485; H01L 29/41725
See application file for complete search history.

(56) References Cited

U.S. PATENT DOCUMENTS

| | | |
|---|---|---|
| 2001/0002722 A1 | 6/2001 | Lee et al. |
| 2002/0111039 A1 | 8/2002 | Moore |
| 2003/0100176 A1 | 5/2003 | Kim et al. |
| 2006/0160343 A1 | 7/2006 | Chong et al. |
| 2008/0070370 A1 | 3/2008 | Wu et al. |
| 2008/0157208 A1* | 7/2008 | Fischer ............ H01L 21/76843 257/368 |
| 2008/0206973 A1 | 8/2008 | Johnson et al. |
| 2008/0293234 A1 | 11/2008 | Ikumo et al. |
| 2009/0050972 A1 | 2/2009 | Lindsay et al. |
| 2009/0218633 A1 | 9/2009 | Hoentschel et al. |
| 2009/0321841 A1 | 12/2009 | Hoentschel et al. |
| 2010/0109046 A1 | 5/2010 | Mehandru et al. |
| 2012/0205728 A1 | 8/2012 | Yin et al. |
| 2012/0223372 A1 | 9/2012 | Alptekin et al. |
| 2012/0273798 A1* | 11/2012 | Alptekin ............. H01L 29/7833 257/77 |
| 2012/0313149 A1* | 12/2012 | Yin ........................ H01L 29/78 257/288 |
| 2013/0001555 A1 | 1/2013 | Yin et al. |
| 2013/0005097 A1* | 1/2013 | Xu .................... H01L 29/66545 438/229 |
| 2013/0113027 A1* | 5/2013 | Chiang ............ H01L 21/28518 257/288 |

* cited by examiner

151

SEMICONDUCTOR DEVICES WITH SHAPED PORTIONS OF ELEVATED SOURCE/DRAIN REGIONS

This application is a continuation of U.S. patent application Ser. No. 13/788,599, filed on Mar. 7, 2013 and claims the benefit of Korean Patent Application No. 10-2012-0055543 filed on May 24, 2012 in the Korean Intellectual Property Office, the disclosures of which are incorporated herein by reference in their entireties.

BACKGROUND

The present invention relates to semiconductor devices and particularly to devices utilizing metal silicide and methods of fabricating the same. As the integration density of semiconductor devices is scaled to 20 nm or less, the interfacial resistance between a metal silicide and silicon may be reduced. This is because the interfacial resistance between the metal silicide and the silicon can act as a dominant component of parasitic resistance of the semiconductor devices.

For example, the interfacial resistance can be reduced by increasing the doping concentration of a source/drain or reducing the schottky barrier height. Also, the interfacial resistance can be reduced by increasing the interface area between the metal silicide and the silicon.

SUMMARY

Embodiments according to the invention can provide method of forming semiconductor devices with metal silicide using pre-amorphization implants and devices so formed. Pursuant to these embodiments, a method of forming a semiconductor device can be provided by forming an opening that exposes a surface of an elevated source/drain region. The size of the opening can be reduced and a pre-amorphization implant (PAI) can be performed into the elevated source/drain region, through the opening, to form an amorphized portion of the elevated source/drain region. A metal-silicide can be formed from a metal and the amorphized portion.

In some embodiments according to the invention, performing the PAI can include forming the amorphized portion to include a PAI lower profile that is remote from the surface, the PAI lower profile having a curved cross-section. In some embodiments according to the invention, a central portion of the curved cross-section is curved.

In some embodiments according to the invention, forming the metal-silicide can be provided by forming the metal-silicide to include a silicide lower profile that is remote from the surface, the silicide lower profile having a curved cross-section. In some embodiments according to the invention, a central portion of the curved cross-section is curved.

In some embodiments according to the invention, forming the metal-silicide can be provided by forming the silicide lower profile at a level that is equal to or higher than a gate oxide layer included in a gate structure that is directly adjacent to the elevated source/drain region. In some embodiments according to the invention, the level is about 15 nm or less.

In some embodiments according to the invention, forming the metal-silicide can be provided by forming the silicide lower profile at a level that is elevated above a level of a channel region associated with at least one directly adjacent gate structure. In some embodiments according to the invention, a depth of the silicide lower profile in the elevated source/drain region is more than one half of a total thickness of the elevated source/drain region.

In some embodiments according to the invention, reducing a size of the opening can be provided by reducing the size of the opening at a bottom of the opening. In some embodiments according to the invention, reducing a size of the opening can be provided by changing a shape at a bottom of the opening to provide curved side walls that curve at the bottom toward the surface of the elevated source/drain region.

In some embodiments according to the invention, reducing the size of the opening can be provided by etching the surface of the elevated source/drain region to recess a level of the surface. In some embodiments according to the invention, reducing the size of the opening can be provided by RF etching the elevated source/drain region and side walls of the opening.

In some embodiments according to the invention, performing the PAI can be provided by forming the amorphized portion to include a PAI lower profile that is remote from the surface, the PAI lower profile having a curved cross-section. In some embodiments according to the invention, the metal-silicide can include an upper recess having a bottom and a side wall, where the bottom is separated from a bottom of the silicide lower profile by a distance that is greater than a distance by which the side wall of the recess is separated from a side wall of the silicide lower profile.

In some embodiments according to the invention, the metal-silicide further includes a convex shaped top, opposite the silicide lower profile. In some embodiments according to the invention, performing the PAI can be provided by implanting Xe into the elevated source/drain region to form the amorphized portion including the PAI lower profile, the amorphized portion having a total thickness of at least about 100 Angstroms.

In some embodiments according to the invention, performing the PAI can be provided by implanting Si into the elevated source/drain region to form the amorphized portion including the PAI lower profile, the amorphized portion having a total thickness of at least about 100 Angstroms.

In some embodiments according to the invention, a method of forming a semiconductor device can be provided by forming an opening that exposes a surface of an elevated source/drain region. A pre-amorphization implant (PAI) can be performed into the elevated source/drain region, through the opening, to form an amorphized portion of the elevated source/drain region and a metal-silicide can be formed from a metal and the amorphized portion.

In some embodiments according to the invention, a semiconductor device can include a substrate including a PMOS region and an NMOS region. A first contact hole can be in an insulating layer exposing a first elevated source/drain region in the PMOS region. A first metal contact can be in the first contact hole on the first elevated source/drain region. A first metal-silicide can be in the first elevated source/drain region in contact with the first metal contact, the first metal-silicide including a first silicide lower profile that is remote from a surface of the first elevated source/drain region, the first silicide lower profile having a curved cross-section and the first metal-silicide including a planar top portion opposite the first silicide lower profile. A second contact hole can be in the insulating layer exposing a second elevated source/drain region in the NMOS region and a second metal contact can be in the second contact hole on the second elevated source/drain region. A second metal-silicide can be in the second elevated source/drain region in contact with the second metal contact, the second metal-silicide including a second silicide lower profile that is remote from a surface of the second elevated source/drain region, the second silicide lower profile having a curved cross-section and the second metal-silicide including a convex top portion opposite the second silicide lower profile.

In some embodiments according to the invention, a method of forming a semiconductor device can be provided by forming an opening that exposes a surface of an elevated source/drain region. The elevated source/drain region can be processed to provide an anisotropic metal diffusion rate within the elevated source/drain region and a metal-silicide can be formed from a metal and the amorphized portion, according to the anisotropic metal diffusion rate, to provide the metal-silicide to include a silicide lower profile that is remote from the surface, the silicide lower profile having a curved cross-section.

DESCRIPTION OF EMBODIMENTS ACCORDING TO THE INVENTION

Figure 1:
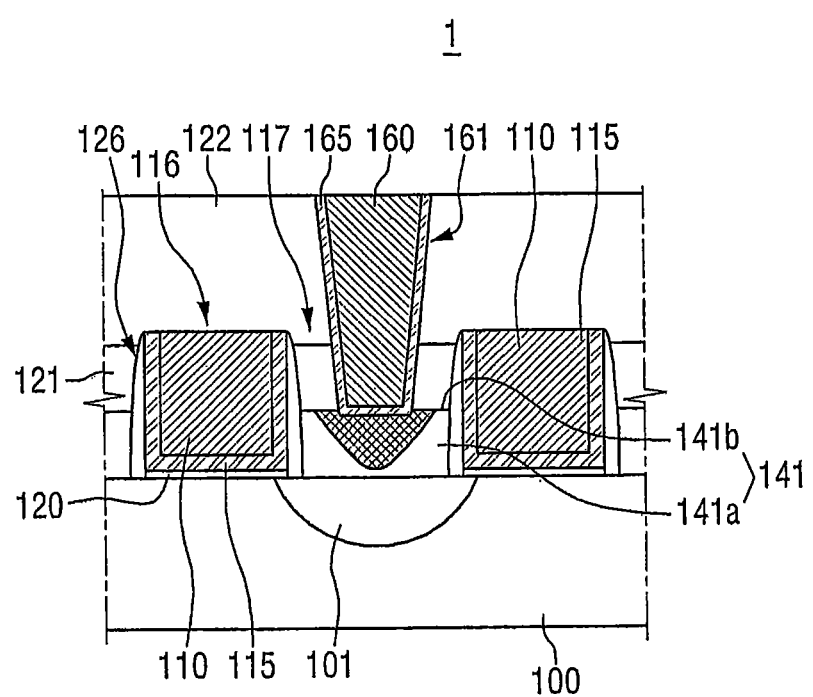
FIG. 1 is a cross-sectional view of a semiconductor device in some embodiments according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Further, the term "cone" or "reverse cone" is used herein to describe the general shapes associated with, for example, amorphized regions and the metal silicide regions formed from the amorphized regions. It will be understood, however, that the term "cone" is not limited to the explicit mathematical or geometric definition of a cone, but rather is used in a general sense to describe the overall shape of the pre-amorphized implant regions and metal silicide regions, so that the actual structures and regions formed may not necessarily conform to the exact mathematical or geometric definition of a cone. Further, it will be understood that such regions that are described as being "cone" shaped, such as the amorphized portion of the elevated source/drain region or the metal silicide formed therefrom, can have a lower profile, that is remote from the surface of an area in which the region is formed, so that the lower profile has a curved cross-section.

Figure 2A:
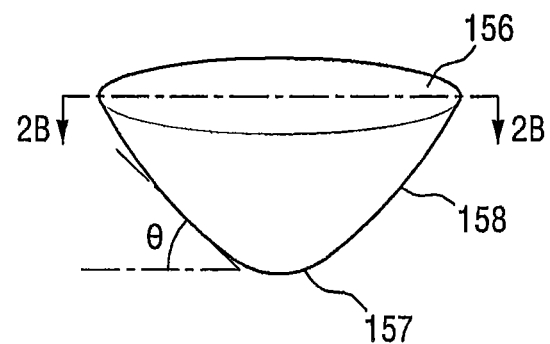
FIG. 2A is a perspective view of a metal silicide shown in FIG. 1.

FIG. 1 is a cross-sectional view of a semiconductor device 1 according to an embodiment of the present invention. FIGS. 2A and B are a perspective view and a cross-sectional view of the metal silicide 151 shown in FIG. 1. Referring to FIG. 1, the semiconductor device 1 may include a substrate 100, gates 116, an elevated source/drain 117, a first interlayer insulating film 121, a second interlayer insulating film 122, a metal silicide 151, and a metal contact 160.

The substrate 100 may be a silicon substrate, a gallium arsenide substrate, a silicon germanium substrate, a ceramic substrate, a quartz substrate or a glass substrate for displays or may be a semiconductor on insulator (SOI) substrate. In the following description, a silicon substrate is used as an example.

The gates 116 are formed on the substrate 100. The gates 116 may included in an n-channel metal oxide semiconductor (NMOS) transistor or a p-channel metal oxide semiconductor (PMOS) transistor. The gates 116 may have a gate last structure or a replacement gate structure. Specifically, the first interlayer insulating film 121 includes an aperture 126, and the gates 116 are disposed in the aperture 126.

The gates 116 may include, for example, a stack of a first metal layer 115 and a second metal layer 110. The first metal layer 115 may be conformally formed along sidewalls and a bottom surface of the aperture 126, and the second metal layer 110 may be formed on the first metal layer 115 to fill the aperture 126. The first metal layer 115 may contain, e.g., TiN, and the second metal layer 110 may contain, e.g., Al. In addition, if the gates 116 have a gate last structure, the first interlayer insulating film 121 may be lower than the gates 116.

The elevated source/drain 117 may be formed between the gates 116. The elevated source/drain 117 may include a doped region 101 formed in the substrate 100 and an epitaxial layer 141 which contacts the doped region 101. The epitaxial layer 141 may be a layer grown by an epitaxial method using the substrate 100 as a base.

The metal silicide 151 may be formed on the elevated source/drain 117. That is, a portion (in particular, the epitaxial layer 141) of the elevated source/drain 117 may include the metal silicide 151. A metal used in the metal silicide 151 may include at least one of Ni, Co, Pt, Ti, W, Hf, Yb, Tb, Dy, Er, Pd, and an alloy thereof. A contact hole 161 passes through the first interlayer insulating film 121 and the second interlayer insulating film 122 and exposes at least part of the metal silicide 151. A barrier layer 165 may be conformally formed alongside surfaces and a bottom surface of the contact hole 161, and the metal contact 160 may be formed on the barrier layer 165 to fill the contact hole 161.

Referring to FIGS. 1 and 2, the elevated source/drain 117 may include a protruding portion 141a which protrudes further than a surface of the substrate 100 and covers both sides of the metal silicide 151. As shown in the drawings, the protruding portion 141a may become narrower as the distance from the surface of the substrate 100 increases. In addition, the protruding portion 141a may cover more than half the vertical length (i.e., height) of the metal silicide 151. In FIG. 1, the protruding portion 141a covers the entire side surface 158 of the metal silicide 151. However, the present invention is not limited thereto.

The metal silicide 151 may not be formed in at least part of a surface 141b of the elevated source/drain 117. That is, referring to FIG. 1, the elevated source/drain 117 may have an unsilicidized surface in a region between the metal silicide 151 and the gates 116.

As shown in FIG. 2A, the metal silicide 151 may include a tip region 159, a side surface 158, and an upper surface 156. The metal silicide 151 may have a reversed cone shape, as shown in the drawings. Therefore, the tip region 159 may face downward (toward the substrate 100), and the upper surface 156 may face upward (away from the substrate 100). In addition, since the metal silicide 151 becomes wider from bottom to top, the side surface 158 may slope at a predetermined angle θ. The predetermined angle θ may be, but is not limited to, about 30 to about 70 degrees. More specifically, the predetermined angle θ may be, but is not limited to, about 40 to about 60 degrees. Also, the tip region 159 of the metal silicide 151 may be located higher than the surface of the substrate 100. In some embodiments the tip region 159 is higher than a gate oxide 120. In some embodiments, the tip region 159 is about 15 nm or less above the gate oxide 120.

Figure 2B:
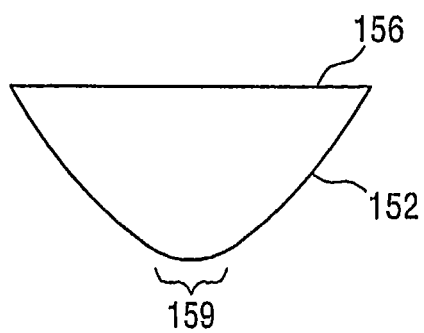
FIG. 2B is a cross-sectional view of the metal silicide shown in FIG. 2A.

As further shown in FIGS. 2A and 2B, the metal silicide 151 cross-section can define a lower profile 152 that is remote from the upper surface 156. Furthermore, as shown in FIG. 2B, the metal silicide 151 in FIG. 2A highlights that the lower profile 152 of the metal silicide 151 has a curved cross-section and further shows that a central portion 159 of the curved cross-section can be curved.

As further shown in FIG. 1, the metal silicide lower profile is at a level in the elevated source/drain 117 that is elevated above a level of a channel region that is associated with the directly adjacent gates 116. In some embodiments according to the present invention, the metal silicide lower profile 152 is at a level that is elevated above a level of a gate oxide layers 120 that can be included in the directly adjacent gates 116. In still other embodiments according to the invention, a depth of the metal silicide lower profile 152 in the elevated source/drain region 117 is more than one half of the total thickness of the elevated source/drain region 117. In still other embodiments according to the invention, the metal silicide lower profile 152 is about 15 nm or less higher than the gate oxide layer included in the directly adjacent gates 116.

The metal silicide 151 and the elevated source/drain 117 may be formed using processes described with reference to FIGS. 11 through 16. It will be understood that, at least a portion of the elevated source/drain 117 may be amorphized, and the amorphized elevated source/drain 1117 can be transformed into the metal silicide 151. Through these processes, the metal silicide 151 may take on the general shape of a reversed cone (to provide a lower profile that has a curved cross-section), and the side surface 158 of the metal silicide 151 may slope at the predetermined angle θ.

Figure 17:
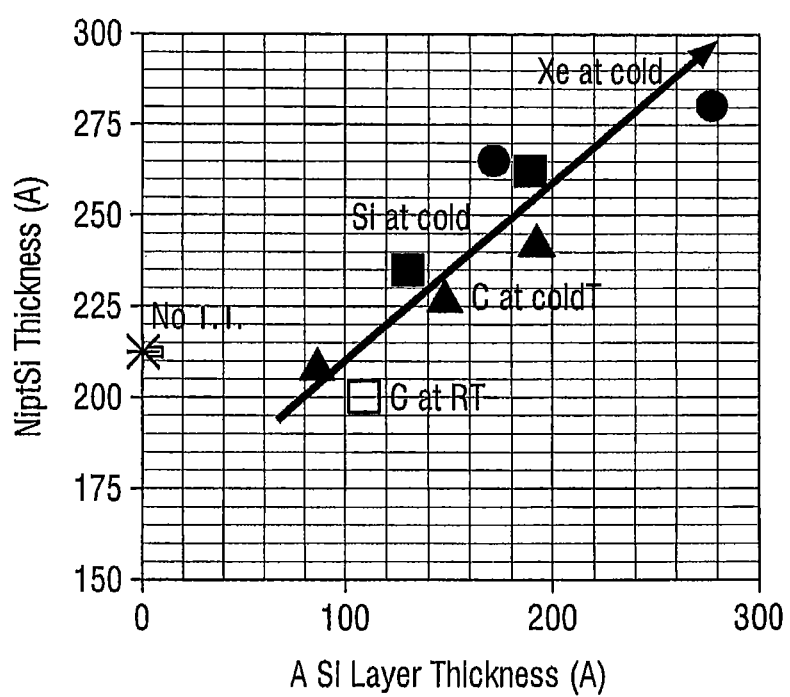
FIG. 17 is a graph illustrating A-Si thicknesses vs. metal silicide thicknesses for different implants.

The amorphization process may be provided by a pre-amorphization implantation (PAI). Specifically, the amorphization process may be a process of implanting at least one of Si, Ge, Xe, and C as illustrated in FIG. 17. Therefore, the metal silicide 151 may contain at least one of Si, Ge, Xe, and C. For example, the semiconductor device 1 may be an NMOS transistor, the epitaxial layer 141 may be Si, and Xe may be used in the amorphization process. In this case, the metal silicide 151 may contain Si and Xe. In another example, the semiconductor device 1 may be a PMOS transistor, the epitaxial layer 141 may be SiGe, and C may be used in the amorphization process. In this case, the metal silicide 151 may contain Si, Ge, and C.

In some embodiments according to the invention, the semiconductor device 1 can reduce the interfacial resistance between the elevated source/drain 117 and the metal silicide 151. This is because the reversed cone shape of the metal silicide 151 may provide a wide contact area between the metal silicide 151 and the elevated source/drain 117. For example, if the reversed cone-shaped metal silicide 151 were compared to a conventional flat (bar-shaped) metal silicide, it may be seen that the contact area between the reversed cone-shaped metal silicide 151 and the elevated source/drain 117 is wider than a contact area between the flat metal silicide and an elevated source/drain due to the lower profile of the metal silicide 151 having a curved cross-section. Also, the reversed cone shape of the metal silicide 151 can promote the flow of current.

Figure 3:
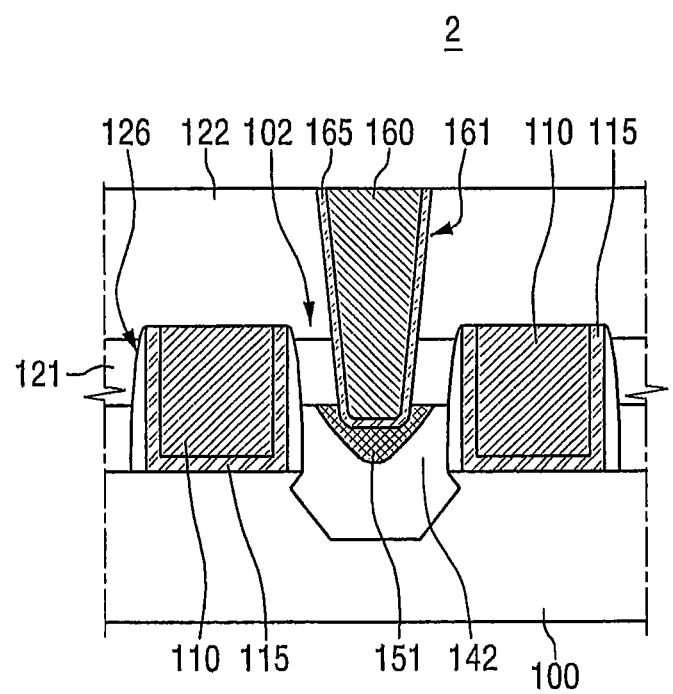
FIG. 3 is a cross-sectional view of a semiconductor device in some embodiments according to the present invention.

FIG. 3 is a cross-sectional view of a semiconductor device in some embodiments according to the present invention. FIG. 4 is a perspective view of a metal silicide 151 shown in FIG. 2. Referring to FIGS. 3 and 4, in some embodiments according to the invention, the metal silicide 151 may have a reversed cone shape, including an upper recess 151a which is recessed from an upper surface 156 of the reversed cone shape toward the tip region 159. The shape of the lower profile of the metal silicide 151, as seen in cross-section, may have be curved.

A vertical length L1 from a bottom of the upper recess 151a to the tip region 159 may be greater than a horizontal length L2 from the sidewall of the upper recess 151a to a side surface 158. Here, each of the vertical length L1 and the horizontal length L2 is a length from a boundary of the upper recess 151a. Since the metal silicide 151 extends in a vertical direction, the vertical length L1 from the bottom of the upper recess 151a to the tip region 159 may be longer than L2. A central portion of 159 of the metal silicide 151 can have a curved profile as shown in FIG. 4B.

The semiconductor device 2 may be a PMOS transistor. An elevated source/drain 102 may contain SiGe. A SiGe layer 142 may be formed in a trench formed in the substrate 100. The SiGe layer 142 may be sigma (Σ)-shaped. The SiGe layer 112 may apply compressive stress to the PMOS transistor, thereby increasing the mobility of carriers (holes) of the PMOS transistor. The SiGe layer 142 may be formed by an epitaxial method to provide, an epitaxial layer 142 that contains the SiGe.

When at least one of Xe and C is used in an amorphization process, the metal silicide 152 may contain not only Si and Ge but also at least one of Xe and C. A barrier layer 165 is formed on the metal silicide 151, and a metal contact 160 is formed on the barrier layer 165. The metal silicide 151 may surround part of the barrier layer 165. Since the metal silicide 151 includes the upper recess 151a, the barrier layer 165 may be formed in the upper recess 151a.

Figure 4A:
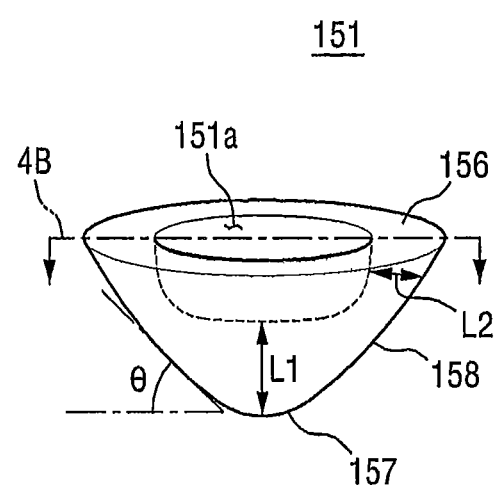
FIG. 4A is a perspective view of a metal silicide shown in FIG. 3.
Figure 4B:
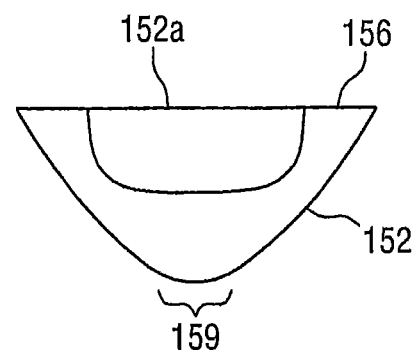
FIG. 4B is a cross-sectional view of the metal silicide shown in FIG. 4.A.

As shown in FIGS. 4A and 4B, the metal silicide 151 may have a reversed cone shape, including an upper recess 151a which is recessed from an upper surface 156 of the reversed cone shape toward the tip region 159. The shape of the lower profile of the metal silicide 151, as seen in cross-section, may have be curved.

Figure 5:
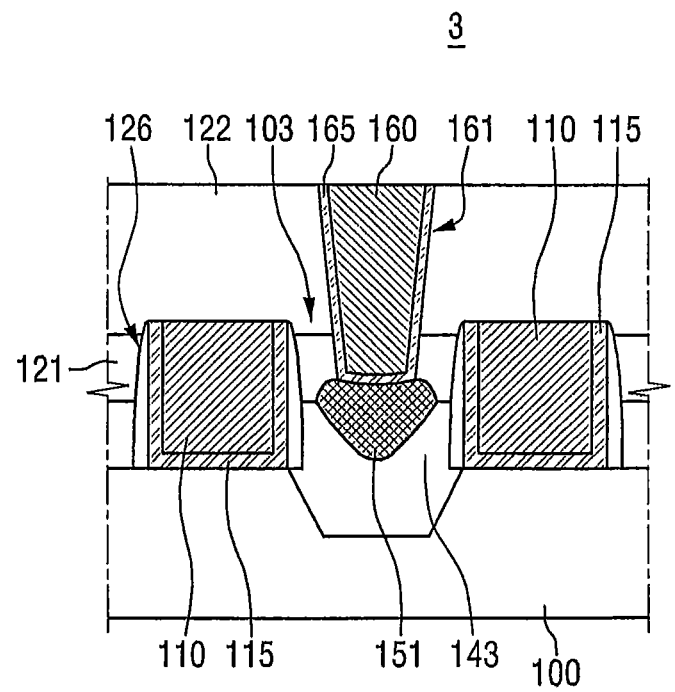
FIG. 5 is a cross-sectional view of a semiconductor device in some embodiments according to the present invention.
Figure 6A:
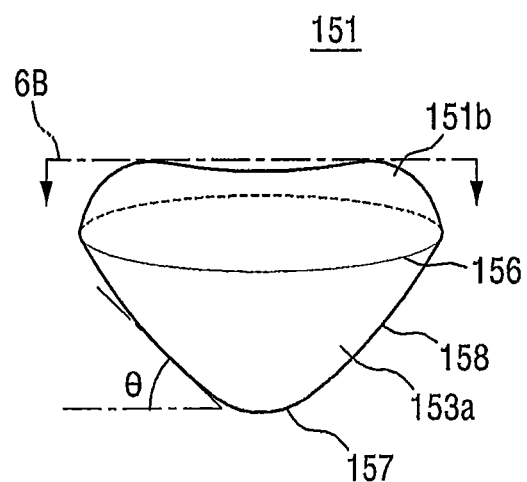
FIG. 6A is a perspective view of a metal silicide shown in FIG. 5.
Figure 6B:
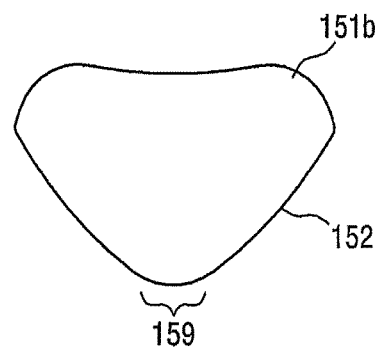
FIG. 6B is a cross-sectional view of the metal silicide shown in FIG. 6A.

FIG. 5 is a cross-sectional view of a semiconductor device 3 in some embodiments according to the invention. FIGS. 6A and 6B are a perspective view and a cross-sectional view, respectively, of a metal silicide 151 shown in FIG. 5.

Referring to FIGS. 5 and 6, the metal silicide 151 may have a reversed cone shape 151a. In particular, the metal silicide 151 may include a convex shaped top 151b which protrudes upward from a horizontal plane 156 of the reversed cone shape 151a. As shown in the drawings, the convex shaped top 151b may be narrower than the width at the horizontal plane 156. The convex shaped top 151b may become narrower from bottom to top.

An elevated source/drain 103 may contain a SiC layer 143 formed in a trench in a substrate 100. The SiC layer 143 may apply tensile stress to an NMOS transistor, thereby increasing the mobility of carriers (electrons) of the NMOS transistor. The SiC layer 143 may be formed by an epitaxial method. When at least one of Ge and Xe is used in an amorphization process, the metal silicide 151 may contain not only Si and C but also at least one of Ge and Xe.

As shown in FIGS. 6A and 6B, the metal silicide 151 may have a reversed cone shape, including a convex shaped top 151b which protrudes upward from a horizontal plane 156 of the reversed cone shape 151a. The shape of the lower profile of the metal silicide 151, as seen in cross-section, may have be curved.

Figure 7:
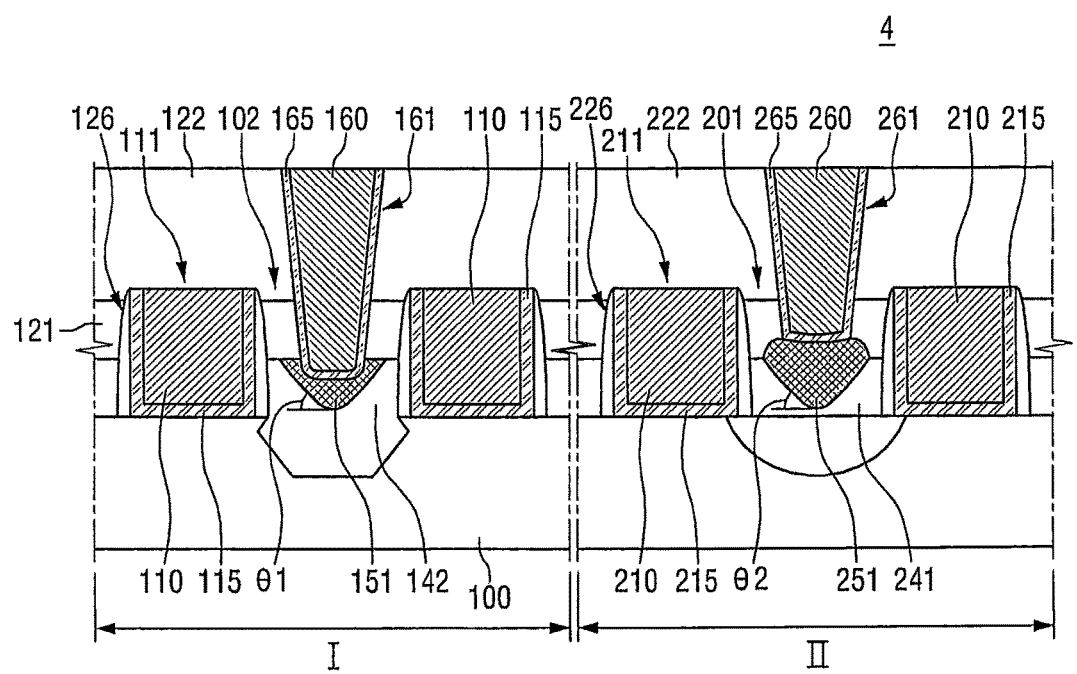
FIG. 7 is a cross-sectional view of a semiconductor device in some embodiments according to the present invention.

FIG. 7 is a cross-sectional view of a semiconductor device 4 in some embodiments according to the invention. In FIG. 7, a case where an NMOS transistor and a PMOS transistor are formed together is illustrated. Referring to FIG. 7, a first region I and a second region II are defined in a substrate 100.

A PMOS transistor may be formed in the first region I. The PMOS transistor may includes a first gate 111, a first elevated source/drain 102 formed on both sides of the first gate 111, and a first metal silicide 151 formed on the first elevated source/drain 102 and having a reversed cone shape.

An NMOS transistor may be formed in the second region II. The NMOS transistor includes a second gate 211, a second elevated source/drain 201 formed on both sides of the second gate 211, and a second metal silicide 251 formed on the second elevated source/drain 201 and having a reversed cone shape. The first metal silicide 151 and the second metal silicide 251 may contain the same material. Here, the same material may include at least one of Ge, Xe, and C.

For example, the first elevated source/drain 102 may contain SiGe, and the second elevated source/drain 201 may contain Si. In this case, if Ge is used in an amorphization process, Ge can be detected not only in the first metal silicide 151 but also in the second metal silicide 251. Alternatively, if Xe is used in the amorphization process, the first metal silicide 151 and the second metal silicide 251 may contain Xe.

As described above, the first metal silicide 151 may further include an upper recess in an upper surface of the reversed cone shape which is recessed toward a tip region. In addition, the second silicide 251 may further include a convex shaped top which protrudes upward from a horizontal plane of the reversed cone shape, and the convex shaped top may be narrower than the bottom surface. The convex shaped top may become narrower from bottom to top.

A side surface of the first metal silicide 151 may be at an angle θ1 greater than an angle θ2 of a side surface of the second metal silicide 251. That is, the side surface of the first metal silicide 151 of the PMOS transistor may be steeper than the side surface of the second metal silicide 251 of the NMOS transistor.

As described above, the first elevated source/drain 102 may include a protruding portion which protrudes further than a surface of the substrate 100 and covers both sides of the first metal silicide 151. The protruding portion may become narrower as the distance from the surface of the substrate 100 increases. The first metal silicide 151 may not be formed in at least part of a surface of the first elevated source/drain 102. The tip region of the reversed cone shape of the first metal silicide 152 is higher than a channel region of the first gate 111.

A tip region of the reversed cone shape of the second metal silicide 251 may also be, but is not limited to, higher than the channel region of the second gate 211. Depending on the fabrication process, the tip region of the second metal silicide 251 may be at about the same level as the channel region or lower.

A first interlayer insulating film 121 including a first aperture 126 and a second aperture 226 is further provided on the substrate 100. The first gate 111 is formed in the first aperture 126, and the second gate 211 is formed in the second aperture 226. In addition, the first gate 111 includes a first metal layer 115 conformally formed along sidewalls and a bottom surface of the first aperture 126 and a second metal layer 110 formed on the first metal layer 115 in the first aperture 126 to fill the first aperture 126. The second gate 211 includes a third metal layer 215 conformally formed along sidewalls and a bottom surface of the second aperture 226 and a fourth metal layer 210 formed on the third metal layer 215 in the second aperture 226 to fill the second aperture 226. As shown in the drawing, the first interlayer insulating film 121 may be lower than the first gate 111 and the second gate 211. The NMOS transistor shown in FIGS. 5 and 6 may be formed in the second region II. That is, the NMOS transistor having the elevated source/drain 103 which includes the SiC epitaxial layer 143 may be formed.

Figure 8:
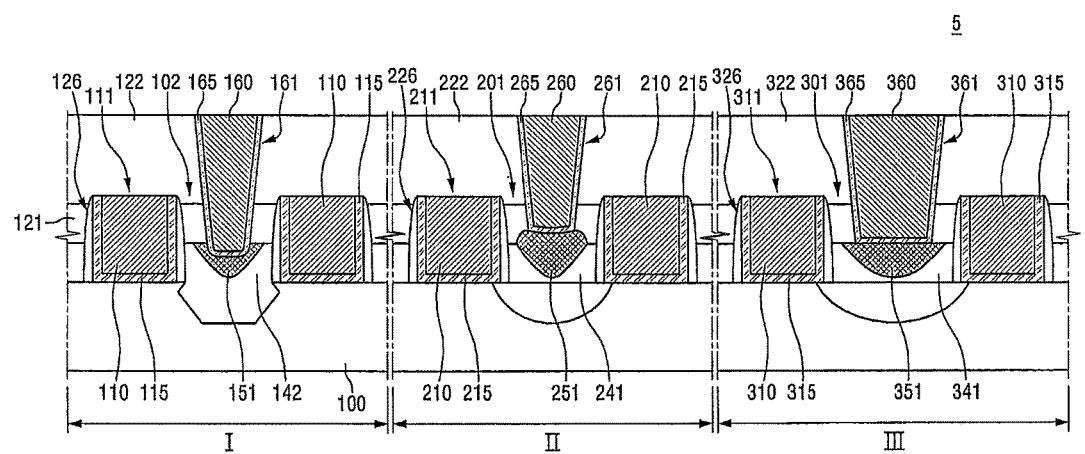
FIG. 8 is a cross-sectional view of a semiconductor device in some embodiments according to the present invention.

FIG. 8 is a cross-sectional view of a semiconductor device 5 in some embodiments according to the invention. Referring to FIG. 8, a substrate 100 includes a first region I, a second region II, and a third region III. The first region I and the second region II may be a memory region and a logic region, respectively, and the third region II may be a peripheral region. The peripheral region may include, for example, an input/output (I/O) region. The third region III may have a lower density and a wider gap between elements than the first region I and the second region II.

A PMOS transistor and an NMOS transistor are formed in the first region I and the second region II, respectively. The NMOS transistor shown in FIGS. 5 and 6 may be formed in the second region II. That is, the NMOS transistor having the elevated source/drain 103 which includes the SiC epitaxial layer 143 may be formed.

An epitaxial layer 341 may be formed on the substrate 100 of the third region III, and a third metal silicide 351 having a reversed cone shape may be formed on the epitaxial layer 341. The third metal silicide 351 may be disposed between adjacent third gates 311. A third elevated source/drain 301 may be relatively wider than a first elevated source/drain 102 and a second elevated source/drain 201. In addition, the third metal silicide 351 may be relatively wider than a first silicide 151 and a second silicide 251.

Figure 9:
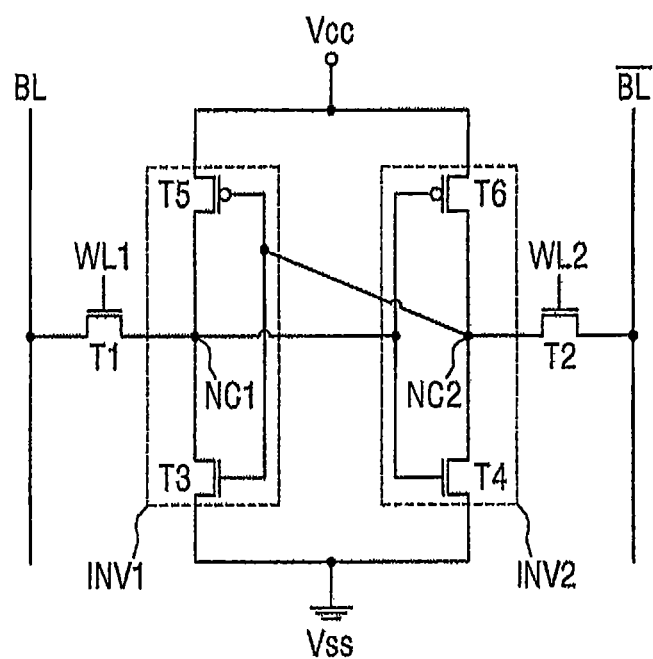
FIGS. 9 and 10 are, respectively, a circuit diagram and a layout view of a semiconductor device in some embodiments according to the present invention.
Figure 10:
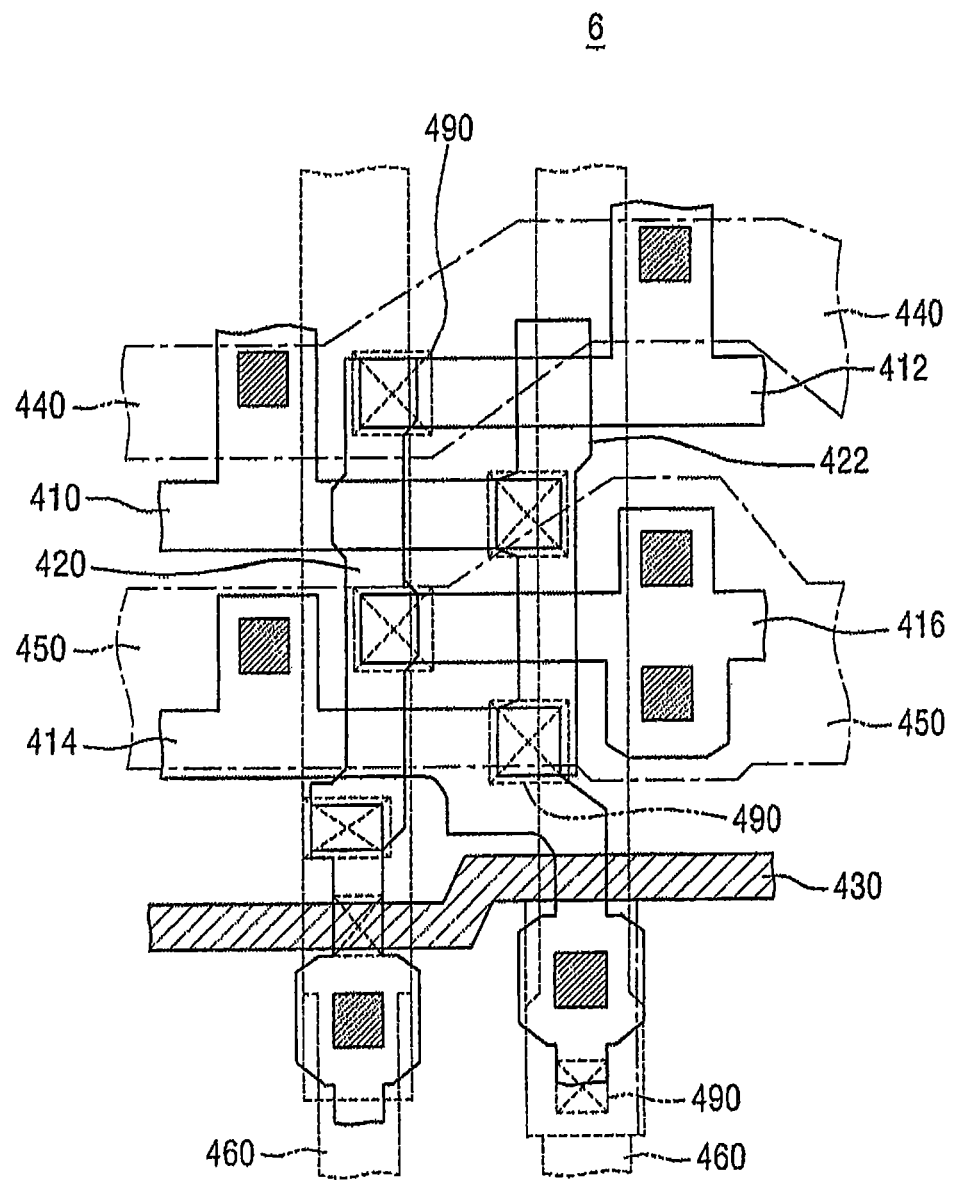

FIGS. 9 and 10 are, respectively, a circuit diagram and a layout view of a semiconductor device 6 in some embodiments according to the invention. The semiconductor devices 1 through 8 according to embodiments of the present invention are applicable to all devices using metal silicide. However, a static random access memory (SRAM) is illustrated as an example in FIGS. 9 and 10.

Referring to FIG. 9, the semiconductor device 6 may include a pair of inverters INV1 and INV2 connected in parallel between a power node Vcc and a ground node Vss and a first transmission transistor T1 and a second transmission transistor T2 connected respectively to output nodes of the inverters INV1 and INV2. The first transmission transistor T1 and the second transmission transistor T2 may be connected to a bitline BL and a complementary bitline /BL, respectively. Gates of the first transmission transistor T1 and the second transmission transistor T2 may be connected to wordlines WL1 and WL2, respectively.

The first inverter INV1 includes a first load transistor T5 and a first driving transistor T3 connected in series, and the second inverter INV2 includes a second load transistor T6 and a second driving transistor T4 connected in series. The first load transistor T5 and the second load transistor T6 may be PMOS transistors, and the first driving transistor T3 and the second driving transistor T4 may be NMOS transistors.

In addition, an input node of the first inverter INV1 is connected to the output node of the second inverter INV2 (see a node NC2), and an input node of the second inverter INV2 is connected to the output node of the first inverter INV1 (see a node NC1), such that the first inverter INV1 and the second inverter INV2 can form one latch circuit.

Referring to FIGS. 9 and 10, reference numerals 410 and 412 indicate active regions of the PMOS transistors, and reference numerals 414 and 416 indicate active regions of the NMOS transistors. Reference numerals 420 and 422 indicate gate electrodes of the first and second driving transistors T3 and T4, and reference numeral 430 indicates gate electrodes of the first and second transmission transistors T1 and T2. Reference numeral 440 indicates a power line (Vcc line), reference numeral 450 indicates a ground line (Vss line), and reference numeral 460 indicates the bitline BL and the complementary bitline /BL. Here, reference numeral 490 indicates a metal contact. The metal silicides and metal contacts of the semiconductor devices 1 through 8 according to the embodiments described above with reference to FIGS. 1 through 8 can be used.

Figure 11:
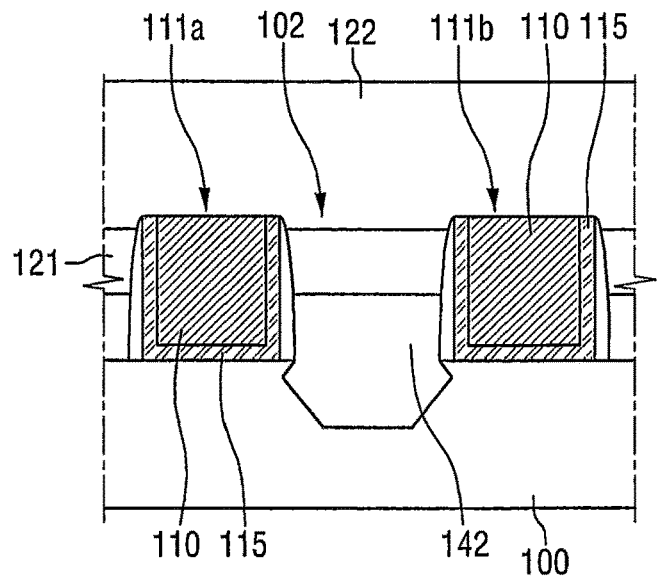
FIGS. 11 through 16B are cross-sectional views illustrating methods of fabricating semiconductor devices in some embodiments according to the present invention.

FIGS. 11A through 16 are cross-sectional views illustrating methods of fabricating the semiconductor device 2 in some embodiments according to the invention. FIGS. 13B through 15B are enlarged cross-sectional views of FIGS. 13A through 15A. Referring to FIG. 11, a pair of transistors are on a substrate 100. The transistors include gates 115/110 and an elevated source/drain 102, respectively, between the pair of transistors 111a/111b. A first interlayer insulating film 121 covers the elevated source/drain 102. A second interlayer insulating film 122 is formed to cover the elevated source/drain 102 and the first interlayer insulating film 121.

Figure 12:
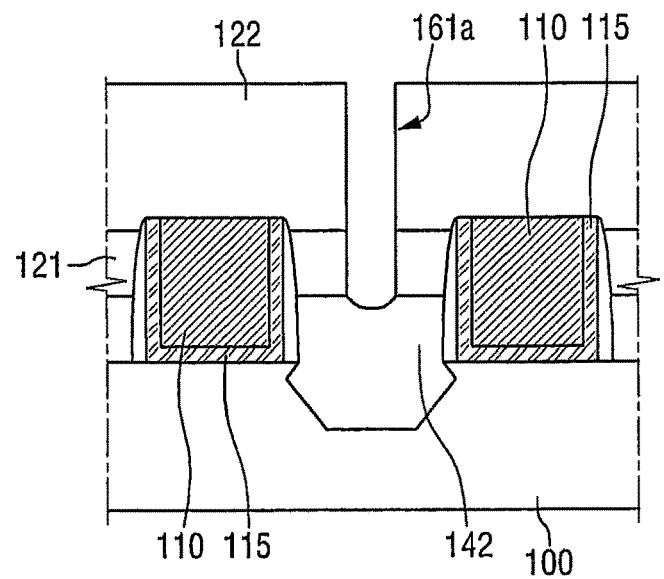

Referring to FIG. 12, a contact hole (or opening) 161a is formed to expose a surface of the elevated source/drain 102 by etching the first interlayer insulating film 121 and the second interlayer insulating film 122. In some embodiments according to the invention, a mask pattern is formed on the second interlayer insulating film 122 and then dry-etched, thereby forming the contact hole 161a.

Figure 13A:
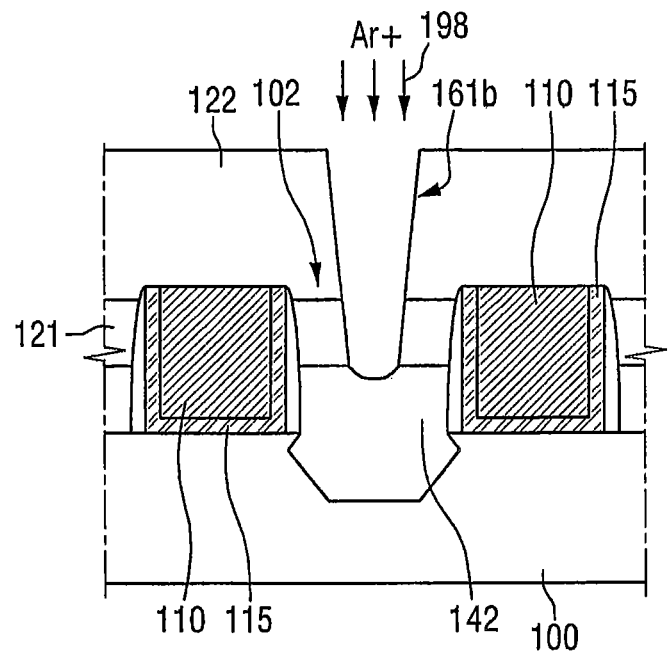
Figure 13B:
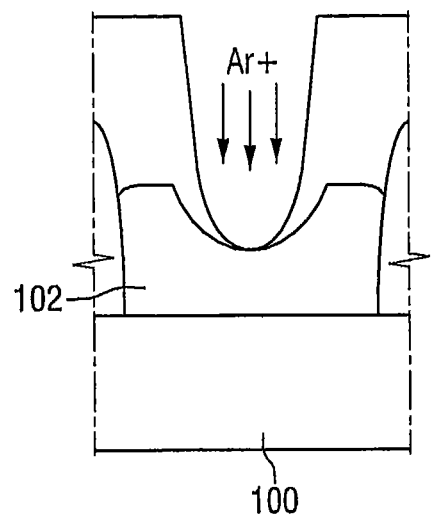

Referring to FIGS. 13A and 13B, a radio frequency (RF) etching process 198 is performed to reduce the size of the contact hole 161b. The RF etching process 198 may use, for example, Ar+. The RF etching process 198 can remove a natural oxide film formed on the elevated source/drain 102. In addition, the RF etching process 198 can reduce the critical dimension (CD) of a bottom surface of the contact hole 161b. This is because the RF etching process 198 may cause etch by-products generated from the elevated source/drain 102, the first interlayer insulating film 121 and the second interlayer insulating film 122 to be re-deposited on sidewalls of the first interlayer insulating film 121 and the second interlayer insulating film 122. Accordingly, the RF etching in the contact hole 161b can change the shape at the bottom of the contact hole 161b to provide curved sidewalls that curve at the bottom of the contact hole 161b toward the surface of the exposed elevated source/drain region 102 to promote the shape shown, for example, in FIG. 13B.

Figure 14A:
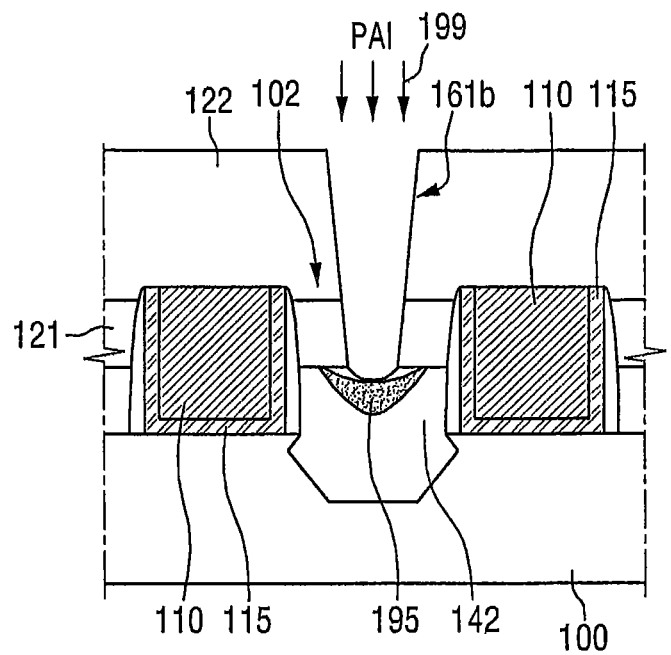
Figure 14B:
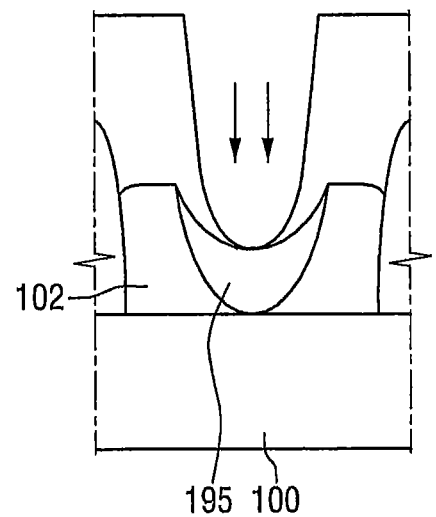

Referring to FIGS. 14A and 14B, at least a portion 152a of the elevated source/drain 102 is amorphized by an amorphization process 199. Specifically, the amorphization process 199 of at least a portion 195 of the elevated source/drain 102 may be provided by a pre-amorphization implant PAI. The amorphization process 199 may include a process of implanting at least one of Si, Ge, Xe, and C. As shown for example in FIG. 14B, the pre-amorphization implant can promote the formation of the amorphous portion 152a to have a lower profile that is curved. It will be understood that the lower profile of the pre-amorphization implant is remote from the surface of the directly adjacent elevated source/drain region.

FIG. 17 is a graph illustrating exemplary thicknesses of amorphous silicon layers formed in the elevated source/drain region versus thicknesses of metal silicide regions formed therein. According to FIG. 17, the use of Si or Xe can promote the formation of thicker metal silicides compared to the use of other impurities, such as C.

Figure 15A:
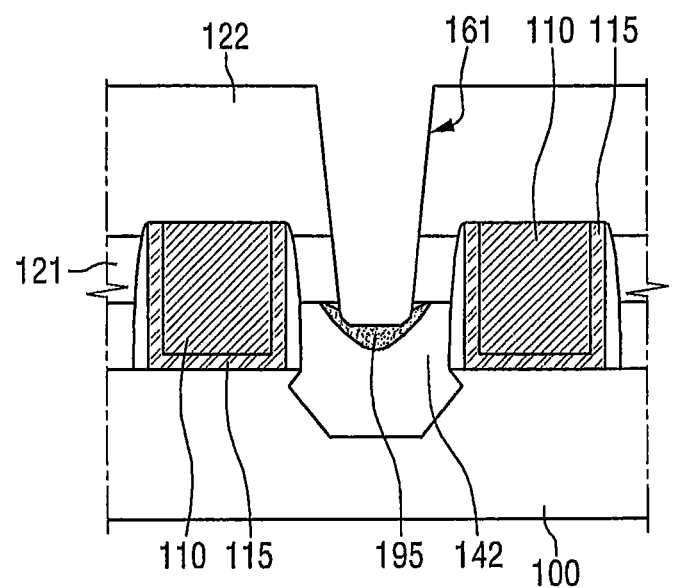
Figure 15B:
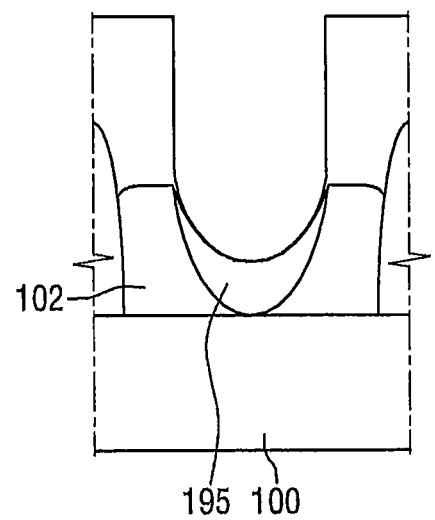

Referring to FIGS. 15A and 15B, a cleaning process may be performed. Specifically, the cleaning process may be performed in-situ. The cleaning process can remove a natural oxide film formed on the elevated source/drain 102 and adjust the shape of the contact hole 161. The cleaning process can be omitted.

Figure 16A:
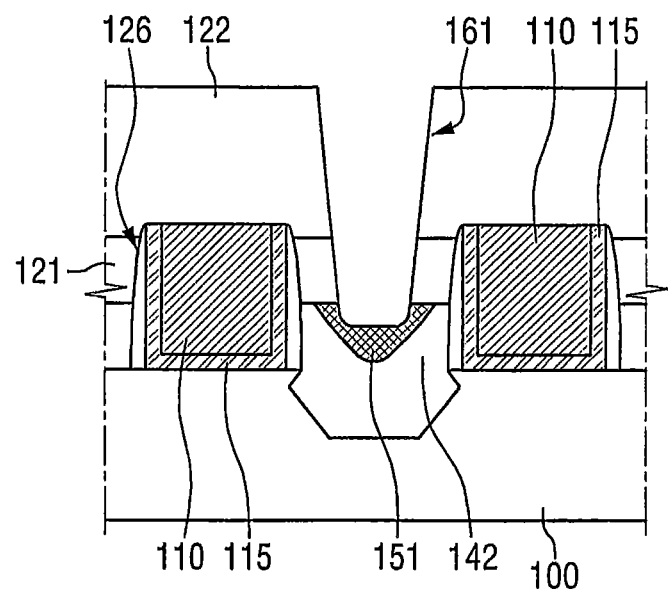
Figure 16B:
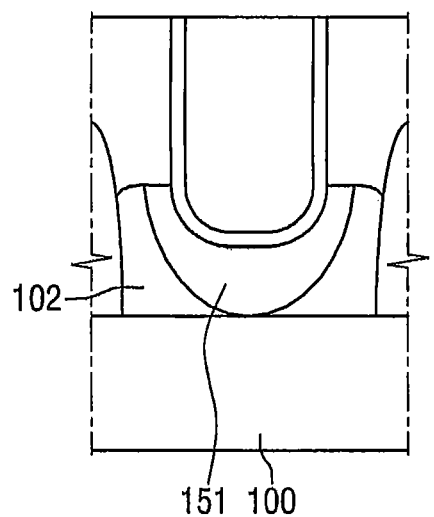

Referring to FIG. 16, the amorphized elevated source/drain 102 is silicided with metal to form the metal silicide 151. The amorphized portion induces a metal silicide 151 to grow more in a vertical direction during the silicide process (see FIG. 16). That is, the amorphization portion can promote the formation of the metal silicide 151 to follow the same general reversed cone shape as the amorphized portion, so that a lower profile of the reversed cone shape can have a curved cross-section. The metal silicide 151 becomes wider from bottom to top. That is, the portion 151a of the amorphized elevated source/drain 102 induces the metal silicide 151 to be generated in the vertical direction more than in the horizontal direction.

A metal layer can be formed on the amorphized elevated source/drain 102. For example, the metal layer may contain at least one of Ni, Co, Pt, Ti, W, Hf, Yb, Tb, Dy, Er, Pd, and an alloy thereof. The metal layer and the amorphized elevated source/drain 102 are made to react by a first heat treatment. For example, the first heat treatment may be performed at a temperature of about 200° C. to about 540° C. In addition, the first heat treatment may use rapid thermal annealing (RTA). An unreacted portion of the metal layer is removed. Then, second heat treatment is performed at a temperature higher than the temperature for the first heat treatment. For example, the second heat treatment may be performed at a temperature of about 540° C. to about 800° C. The second heat treatment may also use RTA.

As shown in FIG. 16, the silicidation of the amorphized layer can promote the growth of the metal silicide to have a lower profile (remote from the surface of the elevated source/drain) that is curved at a central portion of the lower profile. Accordingly, in some embodiments according to the invention, changing the shape of the contact hole at a bottom thereof can promote the formation of the amorphous layer (in response to the pre-amorphization implant) which has a lower profile that is curved which in turn can promote the formation of the metal silicide also to have a curved cross-sectional profile, particularly at a central portion thereof.

Referring back to FIG. 3, a barrier layer 165 is conformally formed along side surfaces and a bottom surface of the contact hole 161. In addition, a metal contact 160 is formed on the barrier layer 165 to fill the contact hole 161.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed:

1. A semiconductor device comprising:
   a first interlayer insulating film, which comprises an aperture, on a substrate;
   a gate in the aperture;
   an elevated source/drain on both sides of the gate;
   a second interlayer insulating film on the first interlayer insulating film and the gate;
   a metal silicide formed in at least part of the elevated source/drain; and
   a metal contact passing through the first and second interlayer insulating film and on the metal silicide,
   wherein the elevated source/drain comprises a protruding portion which protrudes further than a surface of the substrate and covers both sides of the metal silicide, wherein the metal silicide comprises a reversed cone shape with a rounded apex, a planar upper surface, and a tapered side surface that extends from the rounded apex to the planar upper surface, wherein the rounded apex faces toward the substrate, wherein a recess is formed within the reversed cone shape at the planar upper surface thereof, the recess comprising a recess bottom and a circumferentially extending recess sidewall, wherein a vertical length from the recess bottom to the rounded apex is longer than a horizontal length from the recess sidewall to the side surface of the reversed cone shape, and wherein the horizontal length varies from the recess bottom to the planar upper surface of the reversed cone shape.

2. The semiconductor device of claim 1, wherein the protruding portion becomes narrower as a distance from the surface of the substrate increases.

3. The semiconductor device of claim 1, wherein the metal silicide is not formed in at least part of a surface of the elevated source/drain.

4. The semiconductor device of claim 1, wherein the semiconductor device comprises a p-channel metal oxide semiconductor (PMOS) transistor, wherein the elevated source/drain contains SiGe.

5. The semiconductor device of claim 4, further comprising:
   a barrier layer formed between the metal silicide and the metal contact; and
   wherein the metal silicide surrounds part of the barrier layer.

6. The semiconductor device of claim 1, being an n-channel metal oxide semiconductor (NMOS) transistor, wherein the elevated source/drain contains Si.

7. The semiconductor device of claim 1, wherein the gate comprises a first metal layer conformally formed along sidewalls and a bottom surface of the aperture and a second metal layer formed on the first metal layer in the aperture to fill the aperture.

8. The semiconductor device of claim 1 wherein an angle defined by a lowest point of the rounded apex and the tapered side surface is between 30 degrees and 70 degrees.

9. The semiconductor device of claim 1, wherein the metal silicide comprises at least one of nickel (Ni) and platinum (Pt).

* * * * *